(12) United States Patent
Lee

(10) Patent No.: US 7,005,348 B2
(45) Date of Patent: Feb. 28, 2006

(54) METHODS FOR FABRICATING SEMICONDUCTOR DEVICES

(75) Inventor: Kae Hoon Lee, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/027,079

(22) Filed: Dec. 29, 2004

(65) Prior Publication Data

US 2005/0142759 A1    Jun. 30, 2005

(30) Foreign Application Priority Data

Dec. 30, 2003  (KR) ...................... 10-2003-0100569

(51) Int. Cl.
*H01L 21/336*   (2006.01)

(52) U.S. Cl. ...................... 438/259; 438/257; 438/258; 438/261; 438/270; 257/330; 257/332

(58) Field of Classification Search ................ 438/270, 438/257, 259, 261, 258; 257/330, 332
See application file for complete search history.

(56) References Cited

U.S. PATENT DOCUMENTS

| | | | |
|---|---|---|---|
| 6,794,249 B1 * | 9/2004 | Palm et al. | 438/259 |
| 6,888,755 B1 * | 5/2005 | Harari | 365/185.18 |
| 6,927,134 B1 * | 8/2005 | Mo et al. | 438/270 |
| 6,936,887 B1 * | 8/2005 | Harari et al. | 257/319 |
| 2003/0235076 A1 * | 12/2003 | Forbes | 365/185.03 |
| 2005/0077566 A1 * | 4/2005 | Zheng et al. | 257/315 |

* cited by examiner

*Primary Examiner*—Christian D. Wilson
*Assistant Examiner*—Douglas M. Menz
(74) *Attorney, Agent, or Firm*—Hanley, Flight & Zimmerman, LLC

(57) ABSTRACT

Methods for fabricating semiconductor devices are disclosed. An illustrated method includes: etching a semiconductor substrate to form a trench, forming an ONO film on the semiconductor substrate, removing the ONO film from the upper surface of the semiconductor substrate while leaving the ONO film on an inside wall surface of the trench, forming a gate oxide film on the semiconductor substrate adjacent the ONO film, depositing polysilicon on the semiconductor substrate, and selectively removing the polysilicon to form SONOS gate electrodes on the gate oxide film and the trench, respectively. Because opposite sides of the polysilicon gate electrode are covered with an ONO layer, the size of the nitride film may be substantially maximized.

5 Claims, 3 Drawing Sheets

METHODS FOR FABRICATING SEMICONDUCTOR DEVICES

FIELD OF THE DISCLOSURE

The present disclosure relates generally to methods for fabricating semiconductor devices and, more particularly, to methods for fabricating non-volatile memory devices having a nitride film with an enlarged area in an SONOS (Silicon-Oxide-Nitride-Oxide-Silicon) structure to improve the degree of memory concentration, to enable erasure and writing at a low voltage, and to produce a high density device package at low cost.

BACKGROUND

Non-volatile memory devices are constructed such that previously stored data is not erased, even when no power is supplied o the device. Non-volatile Semiconductor Memories (NVSM) may be classified into a floating gate group and a stacked gate group. The NVSMs of the stacked gate group have two or more dielectric films stacked in double or triple. The stacked gate structure is widely employed in cell transistors of the non-volatile memory device.

A typical stacked gate structure includes a tunnel oxide film, a floating gate, a dielectric film, and a control gate electrode stacked on a channel region of the cell transistor in succession. A cell transistor having a SONOS (Silicon-Oxide-Nitride-Oxide-Silicon) structure has been suggested as a means for increasing a surface area of the floating gate in a high density non-volatile memory device package.

As expected, an SONOS non-volatile memory device has read, program, and erase operations. In the program operation, data programming is performed by applying a program voltage to a gate and a drain of a transistor of the cell to form hot electrons which tunnel a gate insulating film. These hot electrons are captured by a nitride film adjacent to the drain. On the other hand, in the erase operation, data is erased by removing the voltage from the gate, the drain, and the source and applying an erase voltage to the semiconductor substrate to drive the electrons captured by the nitride film into the semiconductor substrate.

Referring to FIG. 1, a prior art non-volatile memory device having an SONOS structure has a cell region located in an active region of a P type semiconductor substrate 10. In FIG. 1, the active region is defined in a field region of the semiconductor device 10 by a device isolation film 13 filling a trench 11. A gate oxide film 15 is formed on the entire surface of the cell region of the semiconductor substrate 10. Gate electrodes 21, 23 are formed on the gate oxide film 15. The gate electrodes 21, 23 are spaced a distance from each other. A third gate electrode 35 is located between the first gate electrode 21 and the second gate electrode 23. The third gate electrode 35 is formed after depositing a nitride film 31 and an oxide film 33 on the gate oxide film 15.

The gate oxide film 15, the nitride film 31, and the oxide film 33 of the third gate electrode 35 together form an ONO (Oxide-Nitride-Oxide) film 30. The gate oxide film 15 serves as the lower tunneling oxide film of the ONO film 30. The nitride film 31 deposited on the gate oxide film 15 serves as the trap nitride film of the ONO film 30. The oxide film 33, which is in direct contact with the third gate electrode 35, serves as the upper oxide film of the ONO film 30.

The above described prior art non-volatile memory device having the SONOS structure is fabricated by: forming a gate insulating film 15 on the cell region of the semiconductor substrate 10; stacking a polysilicon layer on the gate oxide film 15; and removing unnecessary portions of the polysilicon layer by photo-etching to form the first and second electrodes 21, 23. Then, the third gate electrode 35 is formed by successively stacking the nitride film 31 and the oxide film 33 on the gate insulating film 15 and the first and second gate electrodes 21, 23, stacking a polysilicon layer on the oxide film 33, and then selectively removing portions of the polysilicon layer, the oxide film 33, and the nitride film 31 by photo-etching.

In prior art devices, the nitride film 31 for storing data is in contact with the third gate electrode 35 through the oxide film 33 and has the same area as the third gate electrode 35. As a result, the area for storing data is limited. Consequently, improving the degree of device concentration has not been easy.

BRIEF DESCRIPTION OF THE DRAWINGS

Wherever possible, the same reference numbers will be used throughout the drawings to refer to the same or like parts.

DETAILED DESCRIPTION

Figure 1:
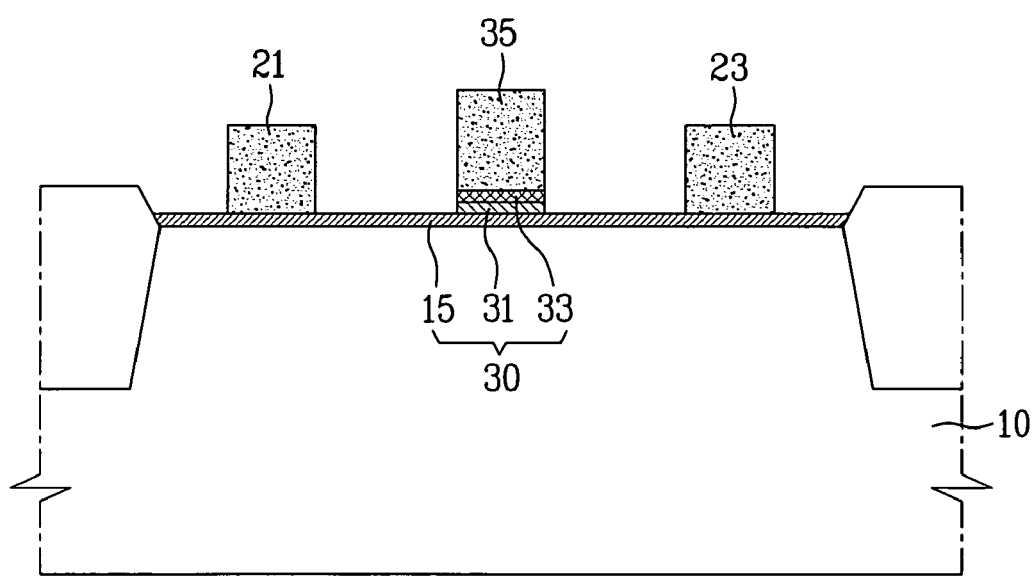
FIG. 1 is a cross-sectional view of a cell region of a prior art non-volatile memory device having a SONOS (Silicon-Oxide-Nitride-Oxide-Silicon) structure.
Figure 2A:
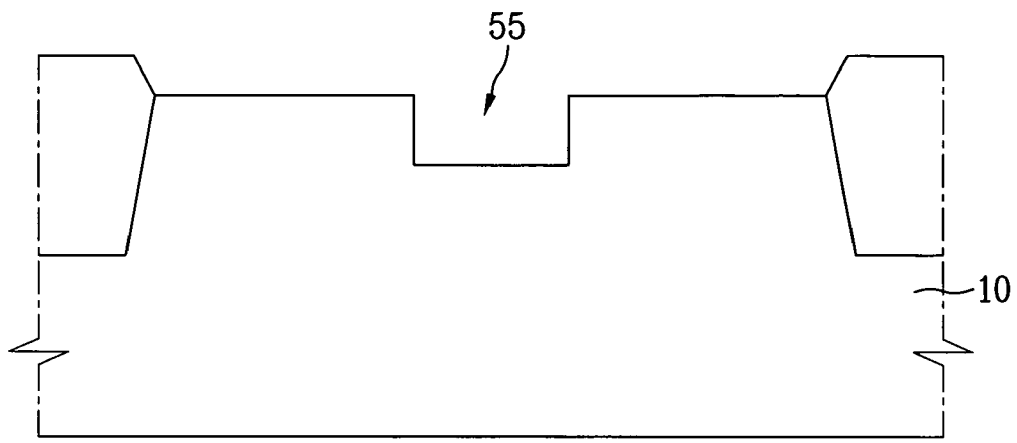
FIGS. 2A–2D are cross-sectional views illustrating an example method for fabricating a semiconductor device performed in accordance with the teachings of the present invention.

FIGS. 2A–2D are cross-sectional views illustrating an example method for fabricating a semiconductor device performed in accordance with the teachings of the present invention. Referring to FIG. 2A, a trench 55 is formed in a region of a semiconductor substrate 10 where an SONOS structure is to be formed. In the illustrated example, the trench 55 is formed to a depth of about 5%–100% of a gate electrode. An example process for forming the trench 55 will now be described.

A hard mask layer (e.g., a nitride film 51) is formed on a single crystal silicon substrate (e.g., semiconductor substrate 10) by, for example, Low Pressure Chemical Vapor Deposition (LPCVD). The nitride film 51 serves as an etch stop film during a subsequent Chemical Mechanical Polishing (CMP) process. A photoresist film pattern 53 for forming a trench is spin coated on the nitride film 51 in an ONO film pattern region. The photoresist film pattern 53 is removed using an etch mask layer by Reactive Ion Etching (RIE) or High Density Plasma (HDP) etching to expose a field region of the semiconductor substrate 10. Next, the semiconductor substrate 10 is etched to a predetermined depth by, for example, RIE or HDP etching to form a trench 55 in a field region of the semiconductor substrate 10. The photoresist film 53 is then removed by ashing or stripping. The semiconductor substrate 10 is then washed with a washing liquid by, for example, wet washing.

Figure 2B:
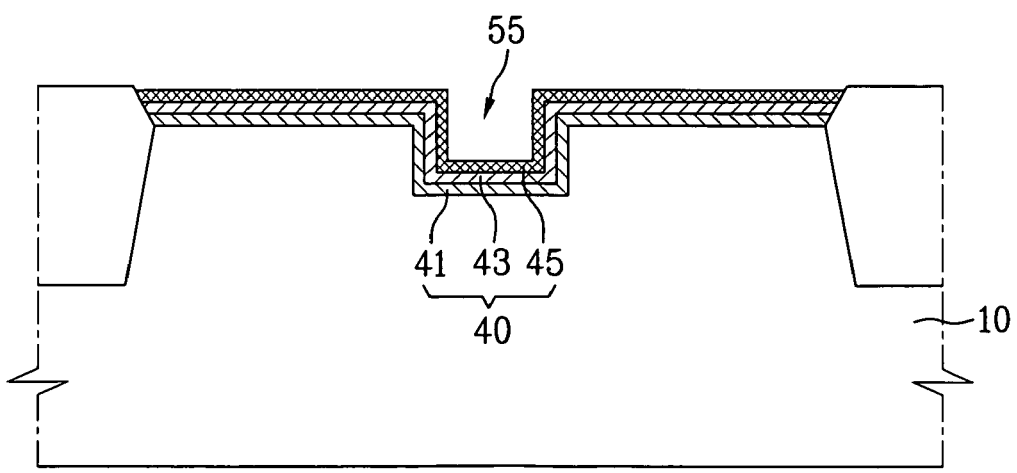

Referring to FIG. 2B, a lower oxide film 41, a nitride film 43, and an upper oxide film 45 are formed on the entire surface of the semiconductor substrate 10 including in the trench 55 to form an ONO film 40.

In the illustrated example, the lower oxide film 41 is formed by growing an oxide to a thickness of about 20–100 Å by, for example, wet oxidation. The nitride film 43 of the illustrated example is formed by depositing a nitride to a thickness of about 30–200 Å by LPCVD. The upper oxide film 45 of the illustrated example is formed to a thickness of about 50–200 Å by High Temperature Oxidation (HTO).

Since the ONO film 40 is on an inside wall surface of the trench 55, it is possible to coat the ONO film 40 thicker than could be done on a flat surface. Accordingly, the nitride film 43, which serves as a trap nitride film, can be formed about 3 to 4 times thicker than in the prior art.

Figure 2C:
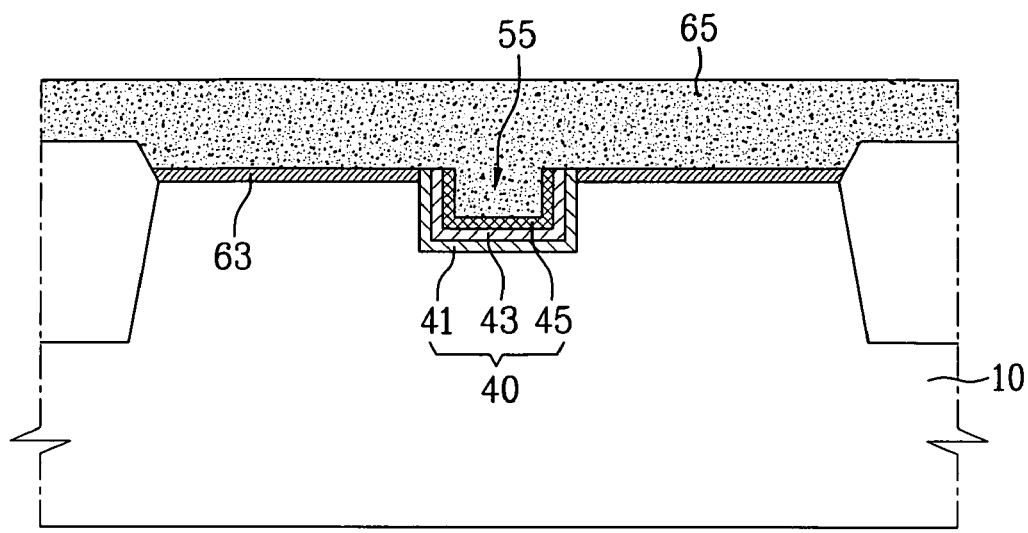

Referring to FIG. 2C, a gate oxide film 63 is formed on the semiconductor substrate 10 in the pattern forming region to a thickness of about 20~50 Å by, for example, thermal oxidation. In more detail, before forming the gate oxide film 63, a high voltage gate oxide film (not shown) is formed on an entire surface of the exposed active region of the semiconductor substrate 10. This high voltage gate oxide film is subjected to photo-etching to remove the high voltage gate oxide film from some areas of the semiconductor substrate 10, while leaving the high voltage gate oxide film on a high voltage logic region of the semiconductor substrate 10. Then, a gate oxide film 63, (e.g., a low voltage gate oxide film), is formed on a low voltage logic region and a cell region of the semiconductor substrate 10 by, for example, thermal oxidation. Then, a polysilicon layer 65 is formed on the entire surface of the semiconductor substrate 10 so as to fill the trench 55.

Next, a photoresist film pattern (not shown) is formed on the polysilicon layer 65 as an ion injection mask layer exposing an N type impurity ion injection region. N type impurities (e.g., phosphor P) are ion injected into the polysilicon layer 65 in the cell region. In the illustrated example, the phosphor P is injected into the polysilicon layer for an NMOS transistor both in the high voltage logic region and the low voltage logic region together with the cell region.

Next, the photoresist film pattern is removed, and the semiconductor substrate 10 is washed with a washing liquid.

Figure 2D:
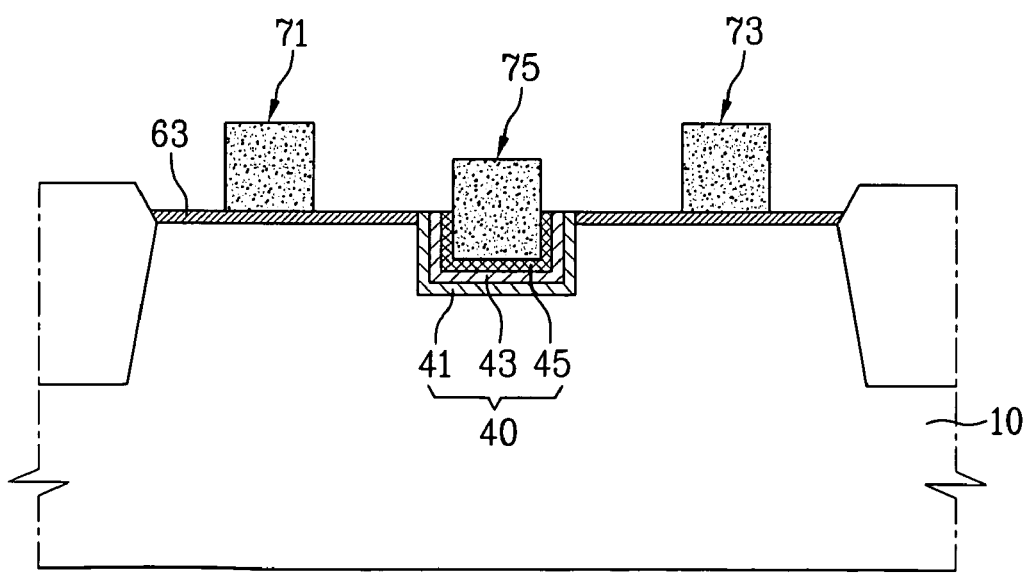

Referring to FIG. 2D, the polysilicon layer 65 is subjected to photo-etching such that the polysilicon layer 65 only remains on the gate electrode forming regions of the gate oxide film 63 to thereby form the first and second gate electrodes 71, 73, and on the ONO film 40 on the inside wall surface of the trench to thereby form a third gate electrode 75. In the illustrated example, before etching the polysilicon to form the SONOS gate electrodes, a BARC (Bottom Anti-Reflect Coating) film is formed to a thickness of about 200~1300 Å on or beneath the photoresist film coated on the polysilicon for photo-etching the gate electrode.

As described above, the disclosed methods can increase an area of the nitride film 40 by etching a region of a substrate 10 to form a trench 55, depositing the ONO layer 40 to cover an inside wall surface of the trench 55, and depositing polysilicon to simultaneously form a high voltage logic region and a low voltage logic region.

Because the opposite sides of the polysilicon of the gate electrode 75 are covered with an ONO layer 40, the size of the nitride film 43 may be maximized. As a result, not only is the data concentration ratio improved, but also, much more data can be stored using the same voltage used in the prior art in data program and erasure operations, thereby permitting fabrication of a high density device package at low cost.

In a disclosed example method for fabricating a semiconductor device, an area of a nitride film is increased in a non-volatile memory device having an SONOS (Silicon-Oxide-Nitride-Oxide-Silicon) structure to improve the degree of memory concentration, and to enable erasure and writing at a low voltage, thereby fabricating a high density device package at low cost.

A disclosed example method for fabricating a semiconductor device comprises: etching a semiconductor substrate to form a trench; forming an ONO film on the semiconductor substrate and in the trench; removing the ONO film from the upper surface of the semiconductor substrate while leaving the ONO film on an inside wall surface of the trench and a region in the vicinity thereof; forming a gate oxide film on the semiconductor substrate adjacent the ONO film; depositing polysilicon on the semiconductor substrate to fill the trench, and selectively removing the polysilicon to form SONOS gate electrodes on the gate oxide film and the trench, respectively.

Preferably, etching a semiconductor substrate to form a trench comprises forming the trench to depth of about 5~100% of the gate electrode.

The ONO layer on the inside wall surface of the trench preferably has a height of about 5~100% of a height of the gate electrode.

Removing the polysilicon to form the SONOS gate electrodes may include forming a BARC (Bottom Anti-Reflect Coating) film to a thickness of about 200~1300 Å on or beneath a photoresist film coated on the polysilicon for photo-etching to form the gate electrodes.

Preferably, the ONO film includes a lower oxide film with a thickness of about 20~100 Å, a trap nitride film with a thickness of about 30~200 Å, and an upper oxide film with a thickness of about 50~200 Å.

It is noted that this patent claims priority from Korean Patent Application Serial Number P2003-0100569, which was filed on Dec. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:
   etching a semiconductor substrate to form a trench;
   forming an ONO film on the semiconductor substrate and in the trench;
   removing the ONO film from an upper surface of the semiconductor substrate while leaving the ONO film on an inside wall surface of the trench;
   forming a gate oxide film on the semiconductor substrate adjacent the ONO film;
   depositing polysilicon on the semiconductor substrate, the polysilicon filling the trench; and
   selectively removing the polysilicon to form SONOS gate electrodes on the gate oxide film and the trench, respectively.

2. A method as claimed in claim 1, wherein etching the semiconductor substrate to form the trench comprises forming the trench to a depth of about 5~100% of a height of the gate electrode.

3. A method as claimed in claim 1, wherein the ONO layer on the inside wall surface of the trench has a height of about 5~100% of a height of the gate electrode.

4. A method as claimed in claim 1, wherein selectively removing the polysilicon to form the SONOS gate electrodes comprises forming a BARC (Bottom Anti-Reflect Coating) film to a thickness of about 200~1300 Å on or beneath a photoresist film coated on the polysilicon.

5. A method as claimed in claim 1, wherein the ONO film comprises:
   a lower oxide film with a thickness of about 20~100 Å,
   a trap nitride film with a thickness of about 30~200 Å, and
   an upper oxide film with a thickness of about 50~200 Å.

* * * * *